United States Patent [19]

Anand, deceased, et al.

[11] Patent Number: 5,111,355
[45] Date of Patent: May 5, 1992

[54] HIGH VALUE TANTALUM OXIDE CAPACITOR

[75] Inventors: Kranti V. Anand deceased, late of Sunnyvale, Calif, by Madhu Anand, sole heir; Michael E. Thomas, Milpitas, Calif.

[73] Assignee: National Semiconductor Corp., Santa Clara, Calif.

[21] Appl. No.: 581,761

[22] Filed: Sep. 13, 1990

[51] Int. Cl.$^5$ .................... H01G 7/00; H01G 9/00; H01G 4/06
[52] U.S. Cl. .................... 361/313; 29/25.42; 357/51
[58] Field of Search .............. 361/311–313; 29/25.42; 357/51

[56] References Cited

U.S. PATENT DOCUMENTS

| | | | |
|---|---|---|---|
| 4,539,434 | 9/1985 | Krause | 174/68.5 |
| 4,882,649 | 11/1989 | Chen et al. | 361/313 |
| 4,959,745 | 9/1990 | Suguro | 361/311 |

OTHER PUBLICATIONS

"Leakage-Current Reduction in Thin $Ta_2O_5$ Films for High-Density VLSI Memories", C. Hashimoto, et al., IEEE Transactions on Electron Devices, vol. 26, No. 1, Jan., 1989, pp. 14–18.

"Promising Storage Capacitor Structors with Thin $Ta_2O_5$ Film for Low-Power High-Density DRAM's", H. Shinriki, et al., IEEE Transactions on Electron Devices, vol. 37, No. 9, Sep., 1990, pp. 1939–1947.

"A High Quality, High Temperature Compatible Tantalum Oxide Film For Advance DRAM Applications", B. W. Shen, et al., IEEE, IEDM, 1987, pp. 582–585.

"High Quality $Ta_2O_5$ Films Using Ultra-High Purity Ta Sputtering Target", C. Hashimoto, et al., Extended Abstracts of the 18th (1986 International) Conference on Solid State Devices and Materials, Tokyo, 1986, pp. 253–256.

"High Capcitance Ultra-Thin $Ta_2O_5$ Dielectric Film Applied To A High-Speed Bipolar Memory Cell", Y. Nishioka, et al., IEEE, IEDM 85, pp. 42–45.

"Asymmetric Conduction in Thin Film Tantalum/Tantalum Oxide/Metal Structures: Interstitial and Substitional Impurity Effects and Direct Detection of Flaw Breakdown", N. Alexrod, et al., Journal Electrochemical Society: Solid State Science, vol. 116, No. 4, Apr. 1969.

"Photo-Process of Tantalum Oxide Films and Their Characteristics", M. Matsui, et al., Japanese Journal of Applied Physics, vol. 27, No. 4, Apr. 1988, pp. 506–511.

Primary Examiner—Donald A. Griffin
Attorney, Agent, or Firm—Irving S. Rappaport; William H. Murray; Frank M. Linguiti

[57] ABSTRACT

A thin film capacitor for use in an integrated circuit includes a lower plate disposed on the silicon substrate of the integrated circuit. The lower plate comprises a barrier layer of conductive material which prevents transport of silicon from the silicon substrate into a layer of dielectric material which is disposed between the lower plate and an upper plate. A portion of the barrier layer can be consumed and transferred into dielectric material by, for example, high temperature oxidation which generates a symmetric series capacitor with the dielectric layer. A layer comprising an oxide of the barrier layer material is formed between the barrier layer and the dielectric layer by consuming an upper portion of the barrier layer. The capacitor is constructed by forming the barrier layer on at least a portion of the silicon substrate, forming the dielectric layer over an upper surface of the barrier layer, oxidizing the upper surface of the barrier layer and forming a layer of electrically conductive material on an upper surface of the dielectric layer.

20 Claims, 1 Drawing Sheet

HIGH VALUE TANTALUM OXIDE CAPACITOR

BACKGROUND OF THE INVENTION

This invention relates to integrated circuit components and methods for forming such components and more particularly to integrated circuit capacitors and methods for forming such capacitors.

Integrated circuit technology is developing to the point where there is an increasing need for capacitors having a high value of capacitance per unit area in both MOS and bipolar integrated circuits. For example in MOS D-RAMS, it is projected that for 4 Mbit circuits, the storage capacitors would need to have a unit capacitance of about 6.0 fF/um$^2$ and operate at about 3.5 V. On the other hand, bipolar circuits also need capacitors having a high capacitance for switched load memory cells in order to reduce cell area, as well as to maintain speed and soft error immunity.

Looking ahead, it is also clear that the trend in future integrated circuits is toward higher lateral packing density and three dimensional circuits. In the near future however, it appears that in three dimensional circuit applications, more of the passive components, i.e. capacitors and resistors, would be located above the silicon substrate level which would be used for active transistors to maintain their performance. Consequently, the passive components would be constructed by thin film deposition technology by necessity.

In order to form capacitors having a high capacitance value, it is necessary to employ a dielectric having a high dielectric constant. In the past, this requirement has been at odds with the use of thin film technology because as the thickness of the dielectric film is reduced below 500A, its dielectric constant begins to drop. For example, tantalum pentoxide (Ta$_2$O$_5$) has a very good dielectric constant, on the order of 25, in thick film form. However, thickness of capacitor dielectric material in silicon integrated circuits is preferably in the range of 50 to 500A. At a thickness on the order of 50 to 100A, the dielectric constant of Ta$_2$O$_5$ drops down to around 6.0.

This apparent drop in dielectric constant is thought to be due to the formation of a series capacitor with other extremely thin dielectric films which are present on the substrate prior to the deposited dielectric formation. This can readily occur for dielectrics reactively formed over supposedly clean silicon substrates which have a thin native oxide present on the substrate surface. Since the dielectric constant of SiO$_2$ is substantially less than materials like Ta$_2$O$_5$, very thin layers of underlying oxide can have adverse effects on the measured capacitance.

In addition to problems caused by a significant drop in the value of the dielectric constant, thinness of the capacitors creates the requirement that they operate at fields in excess of about 1.0 megavolt per centimeter (MV/cm). Leakage currents at such high field strengths become a significant consideration. Indeed, for a given technology, the needs for high capacitance values and low leakages (or high operating voltages) are mutually opposed so that this has become a matter of compromise and design.

Another problem associated with thin film capacitors is their lack of symmetry. Symmetrical capacitors are those in which the capacitance remains relatively constant regardless of the magnitude or polarity of the applied voltage. If symmetry is required, it has been necessary to make the dielectric thicker to increase the breakdown voltage and decrease the leakage of the material at the expense of the capacitance per unit area. This dilemma becomes more significant for those capacitors in which the thin film dielectric is formed directly on silicon.

SUMMARY OF THE INVENTION

It is therefore an object of the present invention to provide a thin film capacitor having superior electric characteristics.

It is another object of the present invention to provide a thin film capacitor having a high capacitance value per unit area.

It is still another object of the present invention to provide a thin film capacitor having low leakage currents at voltages typically encountered in integrated circuit operation.

It is a further object of the present invention to provide a thin film capacitor having a high capacitance value which is substantially independent of the polarity of the applied voltage.

These and other objects are obtained by providing an integrated circuit having a silicon substrate. A layer of dielectric material is disposed on the silicon substrate. A layer of electrically conductive material is disposed between the dielectric layer and the silicon substrate. A portion of the electrically conductive layer is consumed and transformed into a dielectric material by reactively converting the electrically conductive material with a gas. In a preferred embodiment, the electrically conductive layer forms a barrier layer comprising an electrically conductive material which prevents transport of silicon from the substrate into the dielectric layer. A portion of the barrier layer can be consumed and transformed into a dielectric material by, for example, high temperature oxidation which generates a symmetric series capacitor with the deposited dielectric. Accordingly, a dielectric layer comprising an oxide of the barrier layer material is formed between the electrically conductive barrier layer and the dielectric layer by consuming a portion of the barrier layer. The thicknesses of the deposited and transformed dielectrics are paired such that the total capacitance is always greater than 6 fF/um$^2$.

The capacitor is constructed by forming the electrically conductive layer on at least a portion of the silicon substrate; forming a first dielectric layer over an upper surface of the electrically conductive layer; forming a second dielectric layer between the first dielectric layer and the electrically conductive layer by reacting at least the upper surface of the electrically conductive layer with a gas; and forming a second layer of electrically conductive material on an upper surface of the first dielectric layer. In a preferred embodiment, the capacitor is constructed by forming a barrier layer on a least a portion of the silicon substrate; forming the first dielectric layer over an upper surface of the barrier layer; oxidizing the upper surface of the barrier layer to form the second dielectric layer; and forming a layer of electrically conductive material on an upper surface of the first dielectric layer.

DETAILED DESCRIPTION OF THE PREFERRED EMBODIMENT

Figure 1:
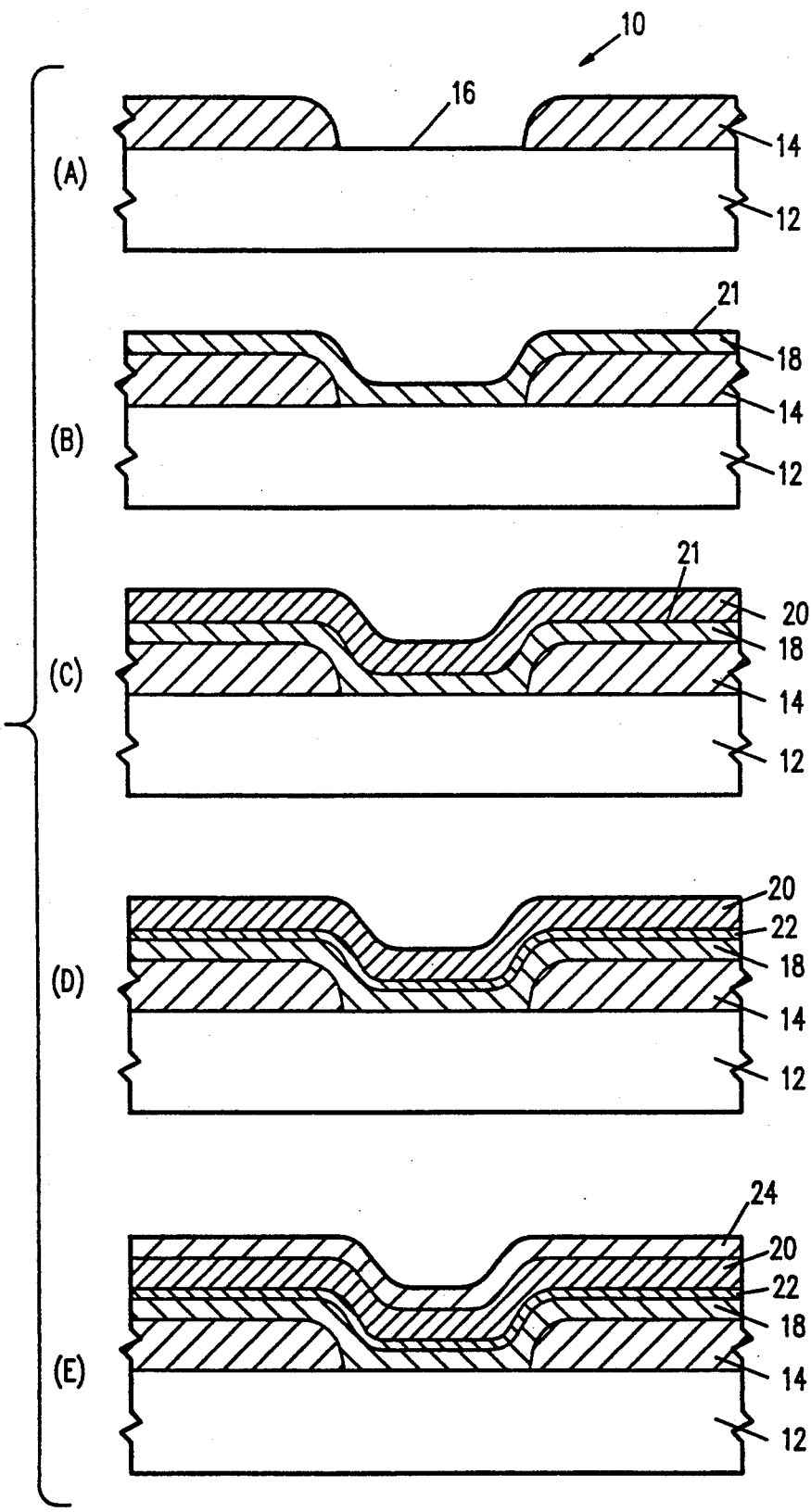
FIG. 1 is a diagrammatic cross-sectional representation of the processing stages of a preferred method for constructing a thin film capacitor on a silicon substrate in accordance with the present invention.

Although a specific form of the invention has been selected for illustration in the drawing, and the following description is drawn in specific terms for the purpose of describing this form of the invention, this description is not intended to limit the scope of the invention which is defined in the appended claims.

Referring to FIG. 1, and particularly to FIG. 1a, there is shown in diagrammatic cross-sectional form, a portion of an integrated circuit device, generally designated 10. The integrated circuit device 10 is depicted at a processing stage wherein a silicon substrate 12, having active devices formed therein, has a layer 14 of electrical insulating material, for example silicon dioxide, formed thereon. A contact window 16, is opened in the insulating layer 14 at a location where a thin film capacitor, in accordance with the present invention, is to be formed.

A layer 18 of electrically conductive material is formed over the insulating layer 14 into the contact window 16 which exposes the surface of the silicon substrate 12. The electrically conductive layer 18 comprises a material that can be reactively converted with a gas into a dielectric which has a minimum dielectric constant value as will be subsequently described. In the preferred embodiment, the layer 18 of electrically conductive material comprises a barrier layer which is formed over the insulating layer 14 into the contact window 16 which exposes the surface of the silicon substrate 12. The barrier layer 18 comprises material which prevents transport of silicon from the substrate 12 into an overlying dielectric layer which will be subsequently described.

The barrier layer has properties such that it can be reactively converted with a gas from a conductor to a dielectric film, for example, via an oxidation process. The converted dielectric has a minimum dielectric constant value when coupled with the deposited dielectric (which will be described later) which at present is determined by practical material trade-offs. The first is that the maximum breakdown field for most materials, excepting $SiO_2$, is typically not greater than 5 MV/cm and places a practical limit on the minimum thickness of the combined dielectric. For operation at 3.5 volts, this value is 70 angstroms and at 5 volts the value is 100 angstroms. Based on this requirement and the fact that a capacitance per unit area of, or in excess of, 6 fF/um$^2$ is desired, the series dielectric constant for the minimum thickness of 70A cannot be less than 4.8 and for 100A not less than 6.8.

In the preferred embodiment, the barrier layer 18 comprises tantalum nitride (TaN) deposited to a thickness of preferably 500A. In the preferred process for constructing the capacitor of the present invention, the TaN barrier layer 18 is formed in a reactive ambient of 1:3 $N_2$:Ar that is used to sputter material from a pure Ta target. In order to keep leakage currents at a minimum, it is preferred that the Ta target have purity load in excess of 99.9999% for reasons which will be subsequently provided. It is preferred that the overall pressure used for the deposition be $1.5 \times 10^{-3}$ torr. Typical deposition rates are on the order of 1 to 3 A/per second.

Next, a layer 20 of dielectric material having a high dielectric constant, is formed over the barrier layer 18 into a contact with an upper surface 21 thereof as shown in FIG. 1c. In the preferred embodiment, the dielectric layer 20 comprises tantalum pentoxide ($Ta_2O_5$) which is deposited in situ by reactive sputtering. In the preferred embodiment, the overall $O_2$:Ar ratio is typically 1:2 to form the tantalum pentoxide phase. The overall pressure for the preferred process is also typically $1.5 \times 10^{-3}$ torr with deposition rates similar to those for the TaN films. The thickness of the $Ta_2O_5$ dielectric layer is preferably in the range of 100 to 500A.

As previously stated, the layer 18 of electrically conductive material, which in the preferred embodiment is a barrier layer, is reactively converted with a gas into a dielectric. In the preferred embodiment, this is accomplished by heating the structure depicted in FIG. 1c in an oxygen environment in order to oxidize a thin layer 22 at the upper surface 21 of the barrier layer 18 as depicted in FIG. 1d. In the preferred embodiment, where the barrier layer material is TaN, the thin oxidized layer is $Ta_2O_5$ with the nitrogen being released into the lattice. Although this is the material selected for the preferred embodiment, any electrically conductive material which when reacted with a gas, preferably oxygen, that is transformed into a non-conducting material with a dielectric constant greater than the minimum practical value of 4.8, described earlier, can be used. Although heating the structure in an oxygen environment may be performed as a separate and distinct step, it is preferred that such heating and the sequential formation of the layers described above be prepared in the same deposition chamber without breaking vacuum.

As shown in FIG. 1e, a layer 24 of electrically conductive material preferably TaN, is formed over the dielectric layer 20. In the preferred embodiment, the TaN layer 24 is typically 500A thick and is formed in a reactive ambient of 1:3 $N_2$:Ar that is used to sputter material from the pure Ta target previously described. The overall pressure used for the deposition is preferable $1.5 \times 10^{-3}$ torr with typical deposition rates on the order of 1 to 3 A/sec.

There are a number of possible reasons that the dielectric constants of prior art devices drop as the thickness of the dielectric film is reduced below 500A. First, after deposition and heat treatment in oxygen, oxygen can diffuse through the $Ta_2O_5$ and transform the underlying Si into $SiO_2$ with a lower dielectric constant. This series capacitor causes a reduction in the relative dielectric constant. Second, it is possible but less probable that the added incorporation of oxygen into the dielectric film, particularly a $Ta_2O_5$ dielectric film, modifies its properties in those fabrication processes utilizing heat treatment in an oxygen ambient. A third mechanism which occurs in a nonoxidizing ambient is that Si may be incorporated into the $Ta_2O_5$ after and during heat treatment. This incorporation could then reduce the effective dielectric constant. Although the former problem can be solved by avoiding the use of oxidizing ambients during processing, the latter cannot be so easily solved.

The problem is solved, in accordance with the present invention, by disposing a barrier layer between the silicon substrate and the capacitor dielectric layer. Where the dielectric layer comprises tantalum oxide in order to obtain a high dielectric constant, the barrier layer is preferably formed of tantalum nitride as described above. Although tantalum nitride is the preferred material for the barrier layer, other materials such as titanium nitride are also suitable.

The properties that render the material suitable for a barrier layer are that it is a conductor or degenerate semiconductor and must be transformable into an insulating dielectric material. The maximum resistivity of the barrier material prior to transformation must not exceed 1 ohm-cm. Secondly, the formed dielectric must have a dielectric constant which is greater than 4.8, as was described earlier based on breakdown considerations. When used in conjunction with tantalum oxide dielectric material, use of tantalum nitride as the barrier layer material has the advantage that the reactive deposition of both tantalum nitride and tantalum oxide can be performed in situ in the same sputtering system. Another advantage is that tantalum nitride, being a good electrical conductor, gives the capacitor of the present invention the feature that it is voltage independent unlike prior art MOS capacitors.

In the preferred embodiment described above, the top plate layer 24 is tantalum nitride. As with the barrier layer 18, a tantalum nitride top plate layer is preferred for a capacitor having a tantalum oxide dielectric material since the reactive deposition of the dielectric and top plate layers can also be performed in situ in the same sputtering system. Although tantalum nitride is the preferred material for the top plate layer 24, titanium/-tungsten is also suitable. The top conductor has a less stringent requirement and can be any metal or degenerate semiconductor of 1 ohm-cm or less. The upper conductor must also satisfy the condition that it does not substantially modify the underlying dielectric such that it degrades the overall capacitance below 6 fF/um$^2$ after heat treatment.

As indicated above, another important issue to consider in the construction of high capacitance thin film capacitors is the leakage current. The amount of leakage current in the preferred embodiment of the thin film capacitor of the present invention is related to the amount of impurities in the tantalum target material. In particular molybdenum and tungsten have oxides which are also conducting and suspect as a source of leakage. Consequently they need to be eliminated from the dielectric layer. This is accomplished by using the ultra pure tantalum targets described above.

Using the preferred embodiment of the process as described above, thin film capacitors have been made with capacitance/unit area values between 10 and 18 fF/um$^2$ with dielectric layer thicknesses of approximately 200A and 100A respectively. These values are typically three to four times greater than capacitors having silicon dioxide dielectric layers of similar thickness. These figures correspond to a relative dielectric constant 20 to 25 instead of about 4 for thermal silicon dioxide. At present, the leakage currents in these thin film capacitors is high, being typically on the order of $1.0 \times ^{-3}$ amp/cm$^2$, but are probably acceptable for specific device applications. By employing the ultra pure tantalum targets described above, dielectrics having very low leakage currents, i.e. on the order of $1.0 \times 10^{-3}$ amps/cm$^2$ at fields of about 1.0 MV/cm, a large dielectric constant, and breakdown strengths on the order of 5.0 MV/cm can be constructed.

It will be understood that various changes in the details, materials, and arrangement of the parts which have been described and illustrated in order to explain the nature of this invention, may be made by those skilled in the art without departing from the principals and scope of the invention as expressed in the following claims.

What is claimed is:

1. In an integrated circuit having a silicon substrate, a thin film capacitor comprising:
    a) a first layer of dielectric material disposed on said silicon substrate;
    b) a first layer of electrically conductive material disposed between said dielectric layer and said silicon substrate, said electrically conductive material comprising a material which can be reactively converted with a gas into an electrically insulating dielectric material which, together with said layer of dielectric material, has a predetermined series dielectric constant;
    c) a second layer of dielectric material disposed between said first dielectric layer and said first layer of electrically conductive material, said second layer of dielectric material comprising said reactively converted electrically conductive material; and
    d) a second layer of electrically conductive material disposed on said first layer of dielectric material.

2. The thin film capacitor in accordance with claim 1 wherein said gas comprises oxygen and said second layer of dielectric material comprises an oxide of said electrically conductive material.

3. The thin film capacitor in accordance with claim 2 wherein said layer of electrically conductive material comprises a barrier layer which prevents transport of silicon from the substrate into the first and second dielectric layers.

4. The thin film capacitor in accordance with claim 3 wherein said barrier layer comprises tantalum nitride deposited to a predetermined thickness.

5. The thin film capacitor in accordance with claim 4 wherein said tantalum nitride is deposited to a thickness substantially equal to 500 angstroms.

6. The thin film capacitor in accordance with claim 4 wherein said first layer of dielectric material comprises tantalum pentoxide.

7. The thin film capacitor in accordance with claim 6 wherein said layer of dielectric material has a thickness in the range of from approximately 100 angstroms to approximately 500 angstroms.

8. The thin film capacitor in accordance with claim 4 wherein said second layer of dielectric material comprises tantalum pentoxide.

9. The thin film capacitor in accordance with claim 1 wherein said second layer of electrically conductive material comprises tantalum nitride.

10. The thin film capacitor in accordance with claim 9 wherein said tantalum nitride layer has a thickness substantially equal to 500 angstroms.

11. A method of forming a thin film capacitor on a silicon substrate of an integrated circuit, said method comprising the steps of:
    a) forming a first electrically conductive layer on at least a portion of said silicon substrate, said first electrically conductive layer comprising an electrically conductive material which can be reactively converted with a gas into an electrically insulating dielectric material having a predetermined dielectric constant;
    b) forming a first dielectric layer over an upper surface of said first electrically conductive layer, said first dielectric layer comprising a material which, together with said reactively converted material of said first electrically conductive layer, has a predetermined series dielectric constant;

c) reactively converting an upper surface of said first electrically conductive layer to form a second dielectric layer between said first electrically conductive layer and said first dielectric layer; and d) forming a second electrically conductive layer on an upper surface of said first dielectric layer.

12. The method in accordance with claim 11 wherein said gas comprises oxygen and step c comprises oxidizing an upper surface of said first electrically conductive layer to form a second dielectric layer between said first electrically conductive layer and said first dielectric layer, said second dielectric layer comprising an oxide of the electrically conductive material of said first electrically conductive layer.

13. The method in accordance with claim 12 wherein step a comprises forming an electrically conductive barrier layer on at least a portion of said silicon substrate, said electrically conductive barrier layer comprising an electrically conductive material which prevents transport of silicon from the substrate into the first and second dielectric layers.

14. The method in accordance with claim 13 wherein step a comprises depositing tantalum nitride to a predetermined thickness on at least a portion of said silicon substrate.

15. The method in accordance with claim 14 wherein step a further comprises depositing said tantalum nitride to a thickness substantially equal to 500 angstroms.

16. The method in accordance with claim 14 wherein step b comprises forming said first dielectric layer comprising tantalum pentoxide.

17. The method in accordance with claim 16 wherein step b further comprises forming said first dielectric layer of tantalum pentoxide to a thickness in the range of from approximately 100 angstroms to approximately 500 angstroms.

18. The method in accordance with claim 14 wherein step c comprises oxidizing an upper surface of said barrier layer to form a layer comprising tantalum pentoxide.

19. The method in accordance with claim 14 wherein step d comprises a forming a layer of tantalum nitride material on an upper surface of said first dielectric layer.

20. The method in accordance with claim 19 wherein step d comprises forming a layer a tantalum nitride to a thickness substantially equal to 500 angstroms.

* * * * *